United States Patent [19]
Schoepe et al.

[11] Patent Number: 6,107,872
[45] Date of Patent: Aug. 22, 2000

[54] ADAPTIVE CONTROL OF RF POWER AMPLIFIER POWER SUPPLY VOLTAGE

[75] Inventors: David A. Schoepe, Penfield; James R. Bremer, Macedon; Michael T. Netkin, Rochester, all of N.Y.

[73] Assignee: Harris Corporation, Melbourne, Fla.

[21] Appl. No.: 09/184,697

[22] Filed: Nov. 3, 1998

[51] Int. Cl.[7] ................................. H03K 5/00; G06G 7/12
[52] U.S. Cl. ........................... 327/560; 327/551; 330/149
[58] Field of Search ...................................... 327/560, 331, 327/332, 306, 309, 544, 545, 551; 330/149, 127

[56] References Cited

U.S. PATENT DOCUMENTS 5,923,215   7/1999   Hans ........................................ 330/149

*Primary Examiner*—Dinh T. Le
*Attorney, Agent, or Firm*—Rogers & Killeen

[57] ABSTRACT

The power supply voltage is adaptively controlled to increase the efficiency and minimize multi-tone intermodulation distortion of a power amplifier either as a function of amplifier overdrive and/or as a function of the frequency of the input waveform. If the input signal is single-tone, the supply voltage is adaptively changed to increase the efficiency of the amplifier as a function of the amount of amplifier overdrive and/or the frequency of the input waveform. If the input signal is multi-tone, the supply voltage is increased to its maximum to minimize intermodulation distortion.

11 Claims, 5 Drawing Sheets

*FIGURE 1* SIMPLIFIED SCHEMATIC OF PA OUTPUT AMP STAGE
(PRIOR ART)

FIGURE 2 EXAMPLE FET $I_D$ vs $V_{DS}$ vs $V_{GS}$ CURVES (PRIOR ART)

FIGURE 3 EXAMPLE FET $I_D$ VS $V_{GS}$ CURVE (PRIOR ART)

ADAPTIVE CONTROL OF RF POWER AMPLIFIER POWER SUPPLY VOLTAGE

BACKGROUND OF THE INVENTION

The application to general purpose amplifiers of low distortion multi-tone, low average power waveforms and high efficiency single-tone, high average power waveforms place contradictory requirements on amplifier design, i.e., multi-tone distortion is typically designed to be just good enough to meet requirements which adds excessive headroom and complexity which is of little value for single-tone waveforms and which decreases overall amplifier efficiency. Conversely, the power supply and power dissipation requirements are largely determined by the single-tone waveform, which result in being overdesigned for handling multi-tone waveforms.

As a result, amplifiers are typically larger and more expensive than they need to be so that they can handle the heat dissipation from high average power waveforms. Alternately, the specification of the amplifier may be changed in order to derate the output at high average power. For example, rather than being specified at 1 KW peak envelope power ("PEP") and average power output, the specification may read 1 kW PEP/500 W average power capability.

It is known in general purpose amplifiers to implement a compromise between low distortion of multi-tone, low average power waveforms and high efficiency of single-tone, high average power waveforms. Circuits have been devised which detect the presence or absence of a multi-tone signal and effect a stepwise reduction on the power applied to the amplifier in response thereto.

For example, the output amplifier stage of a typical prior art power amplifier is shown in FIG. 1 where the RF power from a splitter stage 2 and input transformer 4 is amplified by a FET 6 and applied through an impedance matching transformer 8 to a combiner stage 10. An external RF power control loop automatically (not shown for clarity) varies the amplitude of the input signal so that the peak envelope power output will be held at a constant value. An impedance matching transformer 8 is typically used to transform the output impedance so that the FET 6 sees a constant 12.5 ohm load impedance.

To calculate the efficiency of the power amplifier, consider the case where the input to the amplifier stage is a single-tone waveform and the output of the stage is held constant at 100 W by the power control loop. Under these circumstances, the average current draw from power supply 12 which would be necessary to supply 100 W average power output is $$I = \text{sqrt}(P_{avg}/Z_{eq}) \quad (1)$$

$$= \text{sqrt}(100/12.5) \quad (2)$$

$$= 2.8 \text{ Amps RMS}. \quad (3)$$

If the supply voltage ($V_{supply}$) is 50 VDC and it is sourcing 2.8 Amps RMS, then the power is (50)(2.8)=140 Watts. Since only 100 Watts is delivered to the load, the extra 40 Watts is dissipated as heat in FET 6 and the amplifier stage is only 100/140=71% efficient. To increase the efficiency of the amplifier, a reduction in the power supply voltage to 40 VDC results in power of (40)(2.8)=112 Watts. Since only 100 Watts is delivered to the load, the extra 12 Watts is dissipated as heat in FET 6 and the amplifier stage is a much improved 100/112=89% efficient. However, this improved efficiency comes at a cost of increased distortion, as described below.

Referring to FIG. 2, minimum distortion under multi-tone waveform situations requires that the FET should be operated well into the saturation region where $$V_{DS} >> V_{GS}V_t. \quad (4)$$

Under ideal amplifier conditions, the FET acts as an ideal current source, with its drain current controlled by $V_{GS}$ as shown in FIG. 3. As $V_{supply}$ (and therefore $V_{DS}$) is reduced and it approaches $V_{GS}-V_t$, the FET begins to approach the Triode region, which introduces non-linearities which appear as intermodulation distortion (IMD) in the multi-tone case and as harmonic distortion in the single-tone case. In the single tone case, the unwanted harmonics can simply be filtered off using a harmonic filter (assuming that the harmonic levels are not too severe), but in the multi-tone case, the distortion effects cannot easily be corrected.

In summary, in order to provide low distortion for multi-tone and low average power waveforms, it is advantageous to increase the supply voltage to drive the FET well into the saturation region. Providing low distortion equates to improved voice and data transmission. Alternately, to provide high efficiency for single-tone, high average power waveforms, it is advantageous to have a decreased supply voltage to minimize power dissipated in the FET. Providing high efficiency equates to reduced power consumption and reduced heat dissipation, which further results in increased FET lifespan, and decreased size and cost due to smaller heatsinks and cooling fans.

Because power amplifiers typically have several dB of gain fluctuation over their frequency range and some load impedance variation must be tolerated, lowering the power supply may prevent the power amplifier from delivering the required output power at maximum exciter output drive level. In addition, lowering the voltage of the power supply may "clip" the voltage resulting in very high levels of harmonics requiring very complex and expensive lowpass harmonic filters.

Accordingly, it is an object of the present invention to provide a novel adaptive control and method for the power supply voltage to a general purpose amplifier to optimize the operation of the amplifier for both multi-tone, low average power waveforms and single-tone, high average power waveforms.

It is another object of the present invention to provide a general purpose amplifier which provides both low distortion for multi-tone, low average power waveforms and high efficiency for single-tone, high average power waveforms.

It is yet another object of the present invention to provide a novel general purpose amplifier with decreased supply voltage requirements to minimize power dissipated in the amplifier.

It is still another object of the present invention to provide a novel general purpose amplifier which provides high efficiency which equates to reduced power consumption and reduced heat dissipation, which further results in increased amplifier lifespan and decreased size and cost due to smaller heatsinks and cooling fans.

It is a further object of the present invention to provide a novel microprocessor adaptive control of the power supply to a general purpose amplifier.

It is yet a further object of the present invention to provide a novel method of adaptively controlling in real time the power supply to a general purpose amplifier as a function of the type of input signal to the amplifier, the frequency of the input signal, and the amount by which the amplifier is overdriven.

It is still a further object of the present invention to provide a novel method of adaptively controlling the power supply to a general purpose amplifier by use of a microprocessor that will increase the power supply voltage step-wise to a predetermined level if the input signal power level to the amplifier increases or decreases a predetermined amount in a step-wise fashion.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Present solutions for PA design usually implement a compromise approach where the multi-tone distortion is designed to be just good enough to meet requirements, but which adds excessive headroom and complexity which is of little value for single-tone waveforms and decreases overall amplifier efficiency. On the other hand, the power supply and power dissipation requirements are largely determined by the single-tone waveform case, which result in being over-designed for handling multi-tone waveforms.

As a result, amplifiers are typically larger and more expensive than they need to be so that they can handle the heat dissipation from high average power waveforms. Alternately, some amplifiers simply change their specification in order to derate the output at high average power. For example, rather than being specified at 1 kW PEP and average power output, the specification may read 1 kW PEP/500 W average power capability.

The present invention adaptively changes the supply voltage in response to the detection of the type of signal that is currently being input to thereby optimize the amplifier for either multi-tone signals or single-tone signals.

Figure 1:
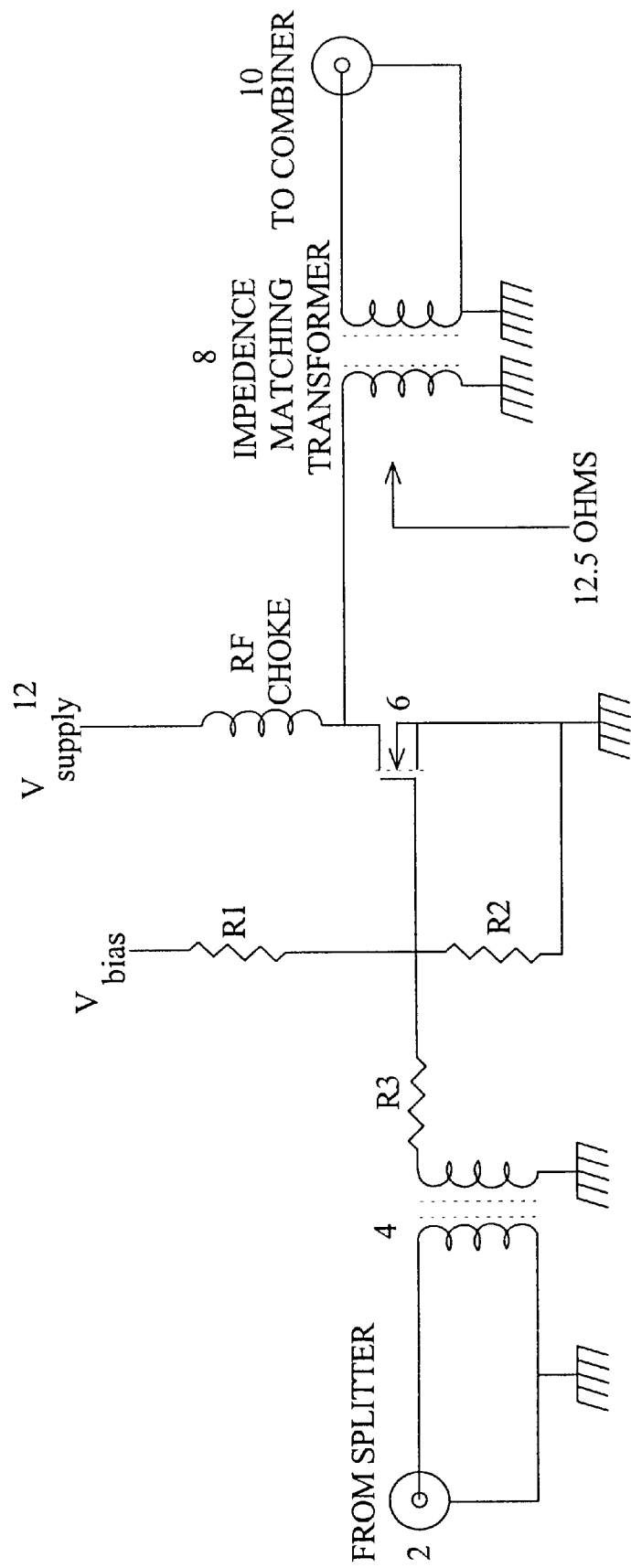
FIG. 1 is a simplified schematic circuit diagram of the output amplifier stage of a prior art power amplifier with the power control loop shown in FIG. 4 removed for clarity.
Figure 2:
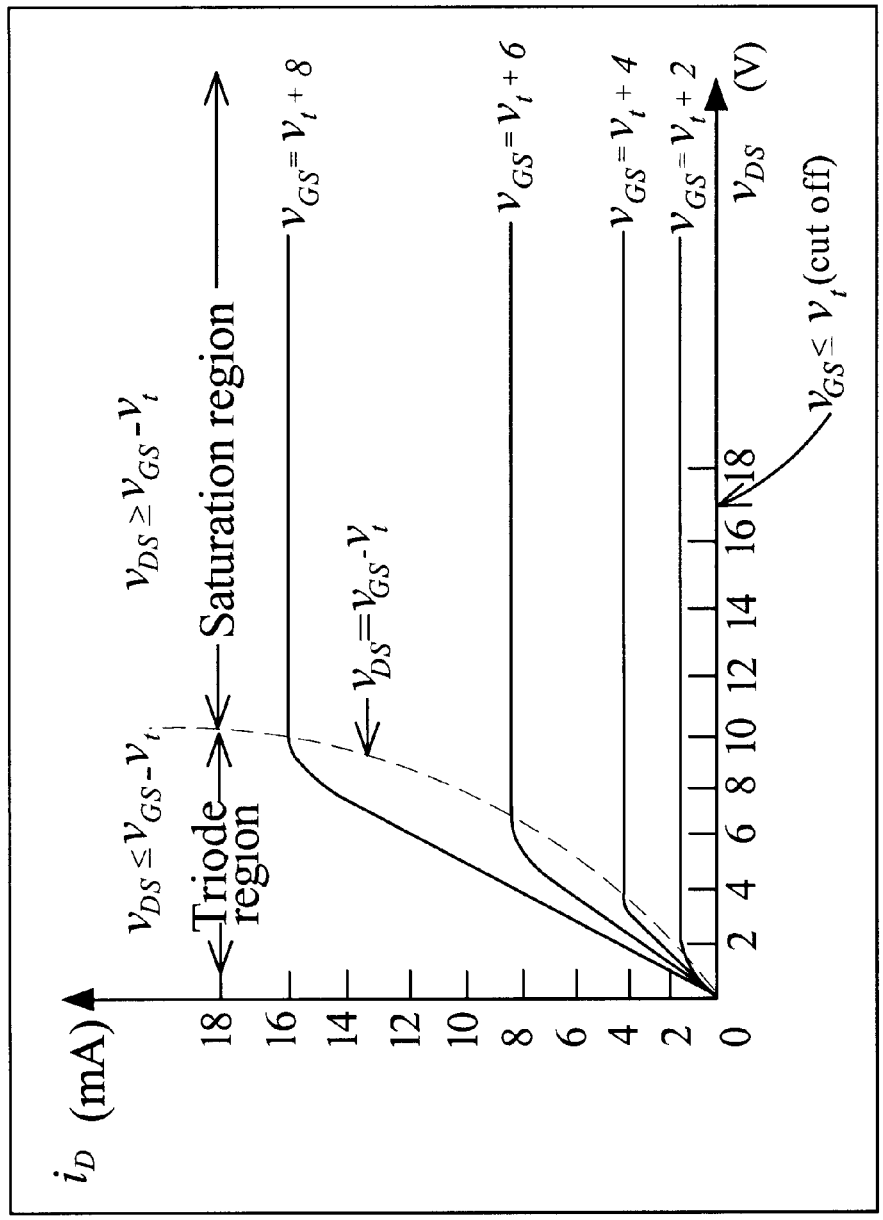
FIG. 2 is a graph illustrating standard operating curves for a FET.
Figure 3:
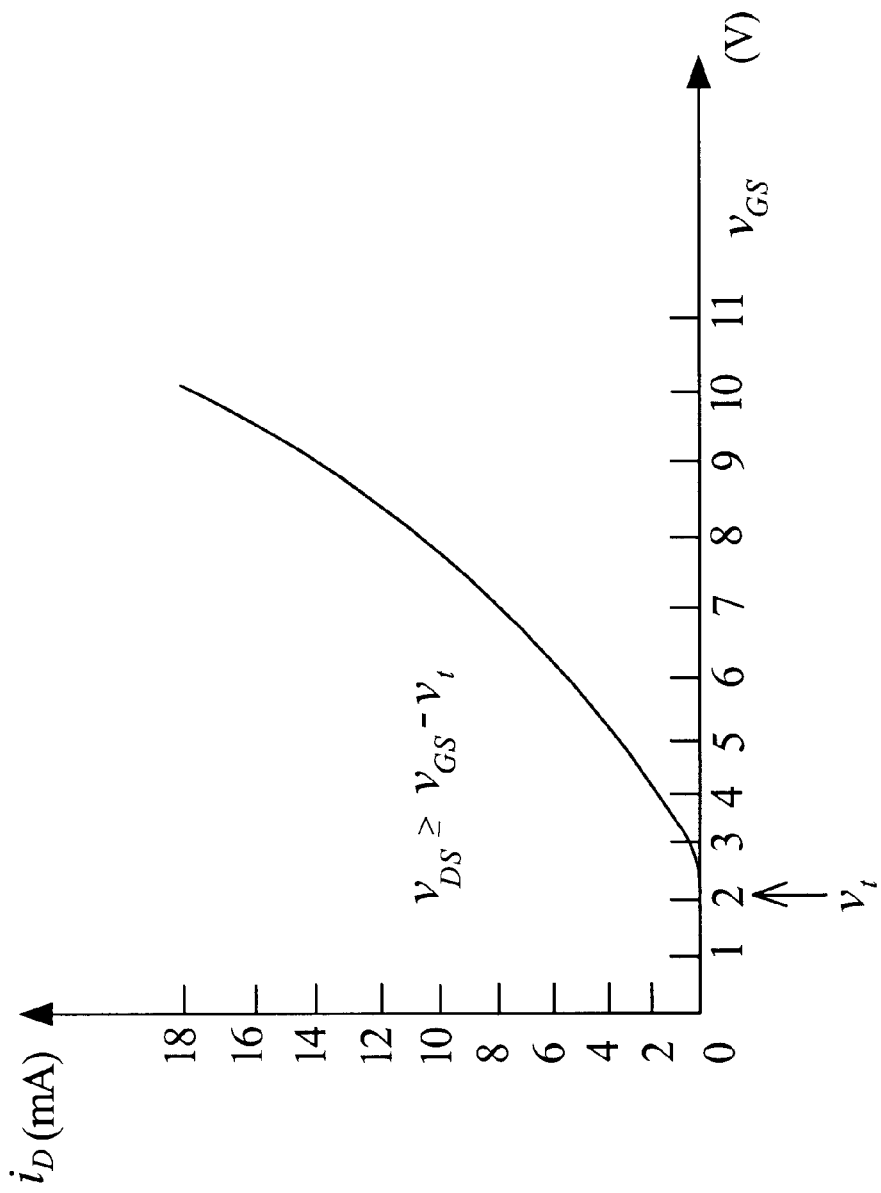
FIG. 3 is a plot of a standard operating curve for a FET.
Figure 4:
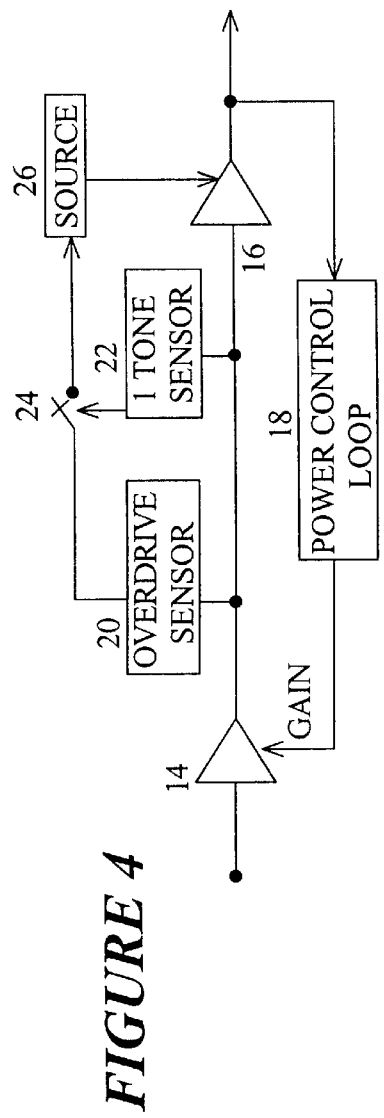
FIG. 4 is a functional block diagram of a first embodiment of the present invention with the source responsive to an overdrive sensor.

With reference to the embodiment of the invention shown in FIG. 4, the input amplifier 14 provides an RF input signal to the power amplifier 16 which amplifies the RF input signal to provide an RF output signal. The power control feedback loop 18 operates automatically conventionally to vary the amplitude of the RF input signal as a function of the RF output signal so that the power amplifier peak envelope power output will be held at a constant value.

A suitable conventional one tone sensor 22 detects the presence or absence of a single-tone waveform at the input terminal of the amplifier 16 and controls the operation of the switch 24 to place the power supply or source 26 for the amplifier 16 under the control of an overdrive sensor 20. The overdrive sensor 20 monitors the RF input signal and operates to control the voltage applied to the amplifier 16 by the source 26.

In operation, the detection of a multi-tone signal by the sensor 22 opens the switch 24 leaving the power applied by the source 26 to the amplifier 16 at a high level thus optimizing the amplifier 16 for a multi-tone signal. The detection of a single-tone signal by the sensor 22 closes the switch 24 to place the source 26 under the control of the overdrive sensor, and the overdrive sensor adaptively controls the voltage applied to the amplifier 16 to optimize the amplifier for a single-tone signal.

Figure 5:
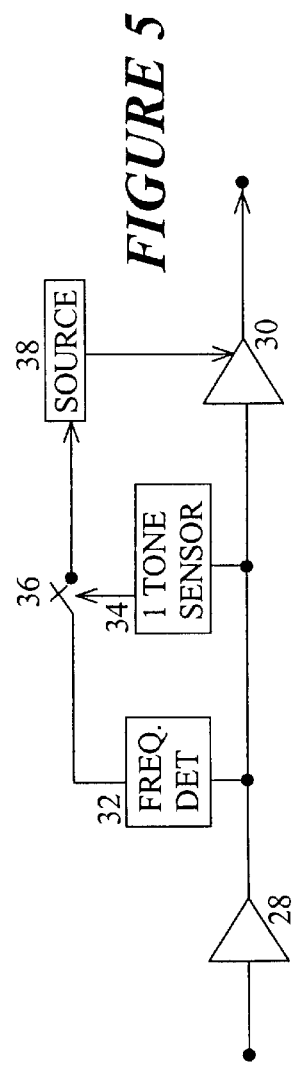
FIG. 5 is a functional block diagram of a second embodiment of the present invention with the source responsive to a frequency detector and with the power control loop shown in FIG. 4 removed for clarity.

A second embodiment of the invention is shown in FIG. 5 where the power control loop 18 shown in FIG. 4 has been omitted for clarity. As shown in FIG. 5, the input amplifier 28 provides an RF input signal to a power amplifier 30. A suitable conventional frequency detector 32 may be used to monitor the frequency of the RF input signal and to operatively control the voltage applied by the source 38 to the amplifier 30.

As in the circuit of FIG. 5, a one tone sensor 34 may be used to control the operation of the switch 36 to place the source 38 under the control of the frequency detector 32.

In operation, the detection of a single-tone signal closes the switch 36 to place the source 38 under the control of the frequency detector 32 and the power applied to the amplifier is reduced as a function of the frequency of the RF input signal.

Figure 6:
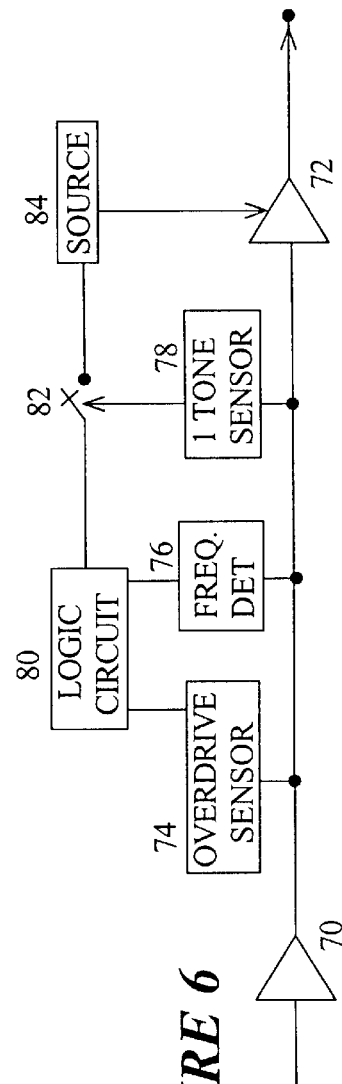
FIG. 6 is a functional block diagram of a third embodiment of the present invention with the source responsive to both an overdrive sensor and a frequency detector and with the power control loop shown in FIG. 4 removed for clarity.

A third embodiment of the invention is shown in FIG. 6 where the power control loop of FIG. 4 has been deleted in the interest of clarity. As shown in FIG. 6, an input amplifier 70 provides an RF input signal to power amplifier 72. An overdrive sensor 74 similar to that of FIG. 4 monitors the RF input signal and provides a first control signal to a suitable conventional logic circuit 80. A frequency detector 76 similar to that of FIG. 5 also monitors the RF input signal frequency and provides a second control signal to Logic Circuit 80. The logic circuit 80 may be used to combine the two control signals to provide a control signal to the source 84 via the switch 82 when closed by the one tone sensor 78.

In operation with the switch 82 closed, the amount of the overdrive and the frequency of the tones of the RF input signal may be combined to adaptively decrease the power applied to the amplifier 72 to optimize the operation of the amplifier 72 for single-tone signals.

Figure 7:
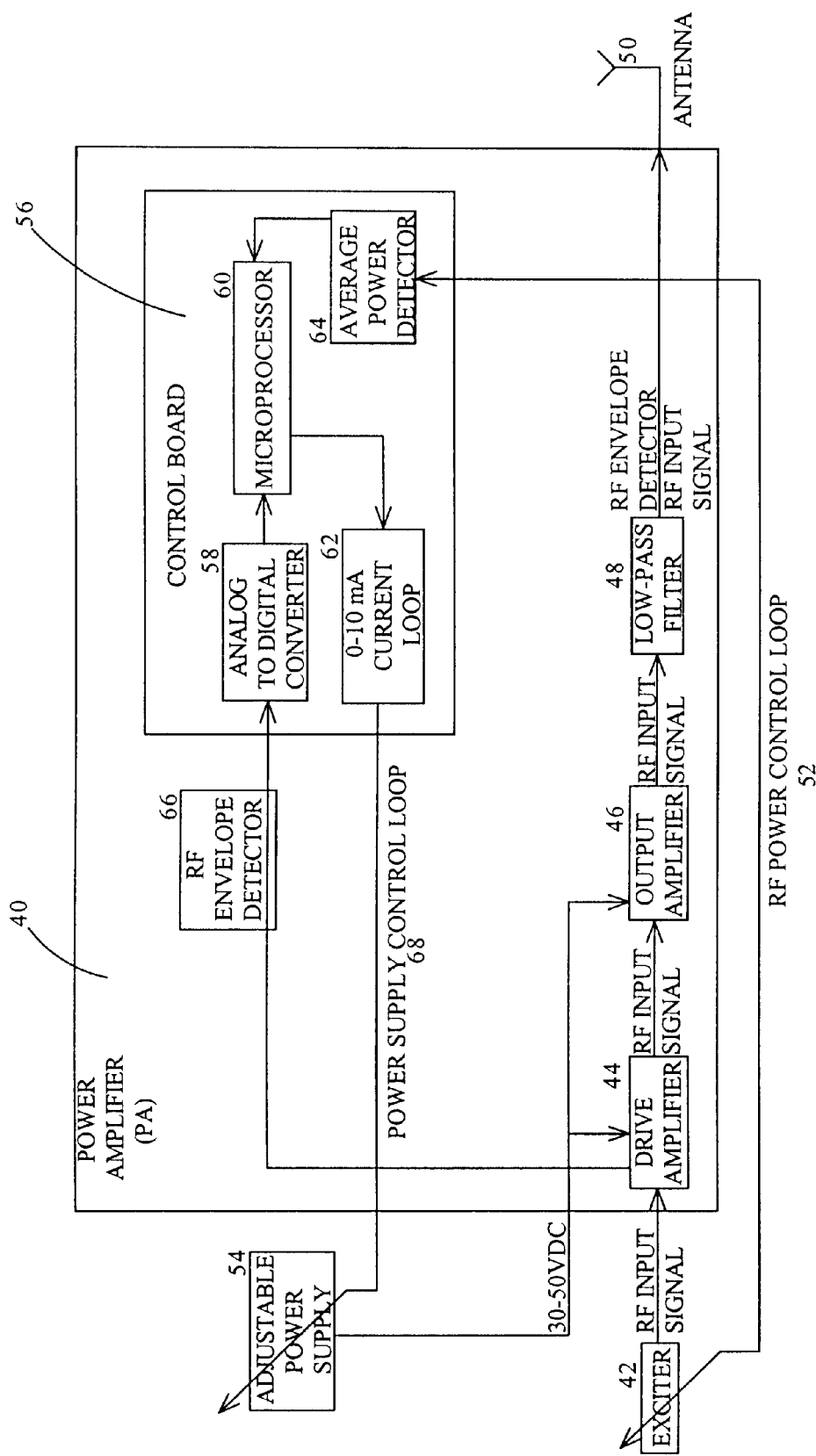
FIG. 7 is a more detailed functional block diagram of the circuit of FIG. 4.

The embodiment of FIG. 4 may be implemented as illustrated in FIG. 7 where the power amplifier 40 comprises a control board 56, a conventional driver amplifier 44, a conventional output amplifier 46, and a low-pass filter 48. The control board 56 may in turn include a suitable conventional analog-to-digital converter 58, a suitable conventional microprocessor 60, a 0–10 mA current loop 62, and a suitable conventional average power detector 64. A suitable conventional adjustable exciter 42 provides an RF input signal to the power amplifier 40 and a suitable conventional adjustable power supply 54 operatively connected to the control board 56 provides power to the output amplifier 46.

In operation, the exciter 42 provides an RF input signal to the driver amplifier 44 and output amplifier 46 which, using power from the adjustable power supply 54, amplify the RF input signal for application through the low pass filter 48 to the antenna 50.

The low pass filter 48 also provides a signal through a suitable conventional RF envelope detector to the average power detector 64 which determines if the waveform being transmitted is a high or low average power waveform, i.e., a single tone or multi-tone signal. This information is sampled by the microprocessor 60.

The RF envelope detector 66 monitors RF input power into the driver amplifier 44, converts the signal to digital form in the analog-to-digital converter 58 for application to the microprocessor 60.

The microprocessor 60 responds to the overdrive of the driver amplifier 44 in the detection of a single-tone signal by the average power detector 64 to adaptively adjust the voltage applied by the adjustable power supply 54 via the power supply control loop 68, e.g., the 0–10 mA current loop 62.

Care must be taken not to change the output voltage from adjustable power supply 54 too quickly because RF power control loop 52 must have time to adapt the RF input signal power to power amplifier 40 to keep the RF output signal power at a constant level. The bandwidth of power supply control loop 68 is desirably several orders of magnitude slower than the RF power control loop 52 to prevent undesirable interaction.

It has been found that 2 dB of overdrive into the power amplifier is a good compromise between power savings and single tone harmonic distortion. The driving source had ample margin to provide this extra 2 dB across the frequency range of interest and remain under closed-loop power control, and the microprocessor may then decrease the power supply until the input power level has increased by at most 2 dB.

As an example of the adaptive control which may be provided, the microprocessor, upon detection of a high-average-power waveform, takes an initial reading of RF input signal power, waits several seconds to make sure that the high average power is being maintained, and slowly decreases the voltage of the source until either the RF input signal power has gone up by 2 dB over the initial reading or until maximum exciter power or minimum source voltage is reached. Upon detection that a high average power waveform is no longer present, the microprocessor increases the power supply voltage back up to maximum. If at any time the microprocessor detects a large increase or decrease in the RF input signal power into the amplifier (e.g., 2 dB or more change), then the microprocessor again increases the power supply voltage to maximum. This is so that in response to a change in the desired power output setting of the exciter from say 500 W to 1 KW, the power supply control loop will re-start and obtain the optimal power supply voltage setting for the increased (or decreased) RF output power requirements.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A power amplifier comprising:
    amplifying means including an input terminal for amplifying an input signal applied to said input terminal as a function of an applied voltage;
    variable voltage means for applying a variable voltage to said amplifying means;
    first sensing means for sensing the overdrive of said amplifying means;
    switch means for operatively connecting said first sensing means to said variable voltage means;
    second sensing means for sensing a predetermined characteristic of the input signal to said amplifying means and for controlling the operation of said switch means in response thereto,
    whereby the voltage applied to said amplifying means by said variable voltage means is adaptively controlled by said first sensing means when the predetermined characteristic of the input signal is sensed by said second sensing means.

2. The power amplifier of claim 1 where the second sensing means is a single-tone sensor for sensing whether the input signal is a single-tone waveform.

3. A method of adaptively controlling the gain of a power amplifier having an input terminal for receiving an input signal comprising the steps of:
    (a) providing an amplifier having an input terminal for receiving an input signal;
    (b) amplifying the input signal received by the input terminal as a function of an applied voltage;
    (c) applying a variable voltage to said amplifier to thereby control the amplification of the input signal;
    (d) sensing overdrive condition of said amplifier; and
    (e) selectively controlling the voltage applied to the amplifier in response to the overdrive condition of the amplifier.

4. The method of claim 3 including the additional step of sensing the frequency of said input signal; and
    selectively controlling the voltage applied to said amplifier is response to both the overdrive condition of said amplifier and frequency of said input signal.

5. A power amplifier comprising:
    amplifying means including an input terminal for amplifying an input signal applied to said input terminal as a function of an applied voltage;
    variable voltage means for applying a variable voltage to said amplifier;
    amplifier overdrive sensing means for sensing the overdrive of said amplifier;
    switch means for operatively connecting said sensing means to said variable voltage means;
    second sensing means for sensing a first predetermined characteristic of the input signal to said amplifier and for controlling the operation of said switch means in response thereto;
    third sensing means for sensing a second predetermined characteristic of the input signal to said amplifier;
    logic means for combining the control signals from said overdrive and third sensing means,
    whereby the voltage applied to said amplifying means by said variable voltage means is adaptively controlled by said overdrive and third sensing means when the first predetermined characteristic of the input signal is sensed by said second sensing means.

6. The power amplifier of claim 5 where the second sensing means is a single-tone sensor for sensing whether the input signal is a single-tone waveform.

7. The power amplifier of claim 6 where said third sensing means is a frequency detector for sensing the frequency of the input signal.

8. A power amplifier comprising:

amplifying means including an input terminal for amplifying an input signal applied to said input terminal as a function of an applied voltage;

variable voltage means for applying a variable voltage to said amplifier;

first sensing means for sensing the frequency of the input signal;

switch means for operatively connecting said sensing means to said variable voltage means;

second sensing means for sensing a predetermined characteristic of the input signal to said amplifier and for controlling the operation of said switch means in response thereto, whereby the voltage applied to said amplifying means by said variable voltage means is adaptively controlled by said first sensing means when the predetermined characteristic of the input signal is sensed by said second sensing means.

9. The power amplifier of claim 8 where the second sensing means is a single-tone sensor for sensing whether the input signal is a single-tone waveform.

10. A method of adaptively controlling efficiency of a power amplifier having an input terminal for receiving an input signal comprising the steps of:

(a) providing an amplifier having an input terminal for receiving said input signal;

(b) amplifying the input signal received by the input terminal as a function of an applied voltage;

(c) applying a variable voltage to said amplifier to thereby control amplification of the input signal;

(d) sensing frequency of the input signal to said amplifier; and (e) selectively controlling the voltage applied to the amplifier in response to the frequency of the input signal.

11. A power amplifier comprising:

amplifying means including an input terminal for amplifying an input signal applied to said input terminal as a function of an applied voltage;

variable voltage means for applying a variable voltage to said amplifying means;

first sensing means for sensing the overdrive of said amplifying means;

switch means for operatively connecting said first sensing means to said variable voltage means;

second sensing means for sensing whether the input signal to said amplifying means is a single-tone waveform and for controlling the operation of said switch means in response thereto;

third sensing means for sensing the frequency of the input signal to said amplifying means;

microprocessor means for combining the control signals from said first and third sensing means, whereby the voltage applied to said amplifying means by said variable voltage means is adaptively controlled by said first sensing means and said third sensing means when the input signal is determined to be a single-tone waveform by said second sensing means.

* * * * *

UNITED STATES PATENT AND TRADEMARK OFFICE
CERTIFICATE OF CORRECTION

PATENT NO. : 6,107,872
DATED : August 22, 2000
INVENTOR(S) : David A. Schoepe, James R. Bremer and Michael T. Natkin It is certified that error appears in the above-identified patent and that said Letters Patent is hereby corrected as shown below:

Title page, item [75], Correct the spelling of the surname of the third-named inventor to read as follows:

Michael T. Natkin

Signed and Sealed this

Eighth Day of May, 2001

Attest:

NICHOLAS P. GODICI

Attesting Officer

Acting Director of the United States Patent and Trademark Office